United States Patent [19]

Summe et al.

[11] Patent Number: 5,366,916
[45] Date of Patent: Nov. 22, 1994

[54] METHOD OF MAKING A HIGH VOLTAGE IMPLANTED CHANNEL DEVICE FOR VLSI AND ULSI PROCESSES

[75] Inventors: Richard A. Summe; Randy A. Rusch; Douglas R. Schnabel; Jack D. Parrish, all of Kokomo, Ind.

[73] Assignee: Delco Electronics Corporation, Kokomo, Ind.

[21] Appl. No.: 13,947

[22] Filed: Feb. 4, 1993

[51] Int. Cl.$^5$ .......................................... H01L 21/265
[52] U.S. Cl. .................................... 437/44; 437/57; 437/909; 437/56; 257/369; 257/500
[58] Field of Search ............... 437/40, 44, 56, 909, 437/917, 57; 148/DIG. 96; 257/500

[56] References Cited

U.S. PATENT DOCUMENTS

| | | | |
|---|---|---|---|
| 4,918,026 | 4/1990 | Kosiak et al. | 437/33 |
| 5,014,098 | 5/1991 | Schlais et al. | 357/23.5 |
| 5,047,358 | 9/1991 | Kosiak et al. | 437/34 |
| 5,169,794 | 12/1992 | Iranmaresh | 437/31 |

FOREIGN PATENT DOCUMENTS 62-54476A 3/1987 Japan .................................... 437/917

OTHER PUBLICATIONS

Dolny et al., "Enhanced CMOS for Analog-Digital Power IC Applications," IEEE Trans. on Electron Devices, vol. ED-33, No. 12, pp. 1985-1991 (1986).
Editorial, "Technology to Watch—National's CMOS Process Tailored for Analog ICs" Electronics, Feb. 6, 1987, pp. 75-76.

Primary Examiner—George Fourson
Assistant Examiner—Richard A. Booth
Attorney, Agent, or Firm—Cary W. Brooks; Jimmy L. Funke

[57] ABSTRACT

A process for fabricating a high voltage CMOS transistor having a non-self aligned implanted channel which permits the operation of the device at high voltages. The non-self aligned implanted channel does not require alignment with the gate electrode of the CMOS device, but is accurately implanted early in the fabrication of the device through reliance on direct wafer stepper technology. As a result, the non-self aligned implanted channel does not require a high temperature drive, such that fabrication of the transistor is compatible with VLSI and ULSI processes, and the transistor can be up-integrated onto logic integrated circuits. Accuracy of the placement of the non-self aligned implanted channel provides for a shorter channel length, which enables the device to be highly area efficient while also increasing the current capability of the device. Furthermore, the transistor is characterized by a large field-induced avalanche breakdown voltage, enhanced by a thick gate oxide, a lightly doped drain, a field oxide region between the gate and the drain, and known field plating techniques.

12 Claims, 3 Drawing Sheets

METHOD OF MAKING A HIGH VOLTAGE IMPLANTED CHANNEL DEVICE FOR VLSI AND ULSI PROCESSES

The present invention generally relates to the manufacture of complimentary metal-oxide-semiconductor (CMOS) integrated circuits. More particularly, this invention relates to a process for forming a high voltage transistor having a large field-induced avalanche breakdown voltage, wherein the process steps employed enable the high voltage transistor to be formed on the same substrate as low voltage transistors, such that fabrication of the high voltage transistor is compatible with VLSI and ULSI processes.

BACKGROUND OF THE INVENTION

Complementary metal-oxide-semiconductor (CMOS) integrated circuits are finding increased use in electronic applications, particularly where low power consumption is a desirable characteristic. With regards to their operating voltages, a CMOS integrated circuit can generally be either a low voltage transistor which operates at voltages of no greater than about six volts, or a high voltage transistor whose operating voltage is in excess of about thirty volts. Low voltage transistors are generally used at the logic and intermediate stages of signal processing while, in contrast, high voltage transistors are often used as current drivers and switches, serving at the input and output stages of the integrated circuit.

In that high and low voltage transistors operate in cooperation with each other, it is often desirable to fabricate these devices on the same substrate. However, a distinguishing characteristic of high voltage circuits is that they require a channel region between the source and drain which can withstand a higher induced electric field without experiencing avalanche breakdown, a well known phenomenon in which electron hole pairs are generated by the electric field, producing excessive currents. As a consequence, high and low voltage circuits are generally different in form, as well as having differences in their fabrication processes. Such differences have generally dictated that high and low voltage circuits be formed on separate chips rather than combined on a common substrate.

U.S. Pat. No. 5,047,358 to Kosiak et al., assigned to the assignee of the present invention, teaches a method in which both high and low voltage transistors can be formed on the same substrate. While CMOS integrated circuits of this type perform well, exhibiting large breakdown voltages of 60 volts or more, it would be highly desirable to improve the area efficiency of these devices by decreasing the source-drain channel resistance ($RDS_{on}$), particularly in terms of being able to employ both high and low voltage devices in Very Large Scale Integration (VLSI) and UltraLarge Scale Integration (ULSI) CMOS processes.

Lateral Diffused MOSFETs (LDMOS) are a type of high voltage transistors which are well known in the art. These transistors are characterized by desirable attributes such as area efficiency, low channel resistance (i.e., a low $RDS_{on}$ value) and high voltage breakdown capability which make them highly suitable for current drivers. The high voltage breakdown capability of a LDMOS device, as compared to conventional CMOS logic devices, is due to a resistive drift region in the drain that reduces the impact ionization and peak electric fields.

As illustrated in FIG. 1, a conventional LDMOS device 10 is characterized by an implant 22 of one conductivity-type within a well region 14 of the opposite conductivity-type. In particular, the implant 22 is self-aligned to the source end of the gate electrode 18, necessitating that the gate electrode 18 be formed prior to forming the implant 22. Alignment of the implant 22 with the gate electrode 18 permits accurate placement of the self-aligned implant 22 for purposes of enhancing area efficiency. The self-aligned implant's dopant, illustrated in this case as acceptors, overwhelms the well's dopant, in this case, donors, so as to form the low resistance channel adjacent the gate electrode 18. The doped impurity in the channel increases the concentration of acceptors in the channel, thereby decreasing the depletion width spreading of the source-drain region of the device. As a result, the channel length can be smaller such that the $RDS_{on}$ value decreases and the current driving capability of the device 10 is increased.

However, because the implant 22 is self-aligned with the gate electrode, the implant 22 must be laterally diffused beneath the gate electrode 18 so as to extend the channel beneath the gate of the transistor 10. To do this, a high temperature drive, typically at a temperature of about 1100° C. or higher, is used to laterally diffuse the self-aligned implant 22.

Though the above operational characteristics of the LDMOS are desirable in terms of enabling the fabrication of an area efficient, high voltage transistor within an integrated circuit, the required high temperature drive is generally incompatible with VLSI and ULSI processes. Particularly, the high temperature drive causes the excessive diffusion of implants in other CMOS circuit devices on the same substrate, thus foreseeably changing the electrical characteristics of the devices and also possibly inducing stresses in smaller devices which may lead to current leakage. Furthermore, because of the high temperature drive required by an LDMOS, typical LDMOS processing with CMOS devices requires multiple levels of polysilicon to define the low voltage CMOS gates, in addition to the polysilicon level that defines the LDMOS gate. Therefore, LDMOS processing is not generally conducive to up-integrating into VLSI and ULSI CMOS processes.

Thus, what is needed is an area efficient, high voltage CMOS device which is also compatible with VLSI and ULSI processes. Such a device would enable the fabrication of CMOS integrated circuits having both high and low voltage transistors on the same substrate. Preferably, such a device would exhibit a large field-induced avalanche breakdown voltage, while also offering low channel resistance so as to result in an area efficient, high voltage switch which can be up-integrated onto logic integrated circuits with VLSI and ULSI processes.

SUMMARY OF THE INVENTION

It is an object of this invention to provide a high voltage CMOS device which is compatible with VLSI and ULSI processes, such that the high voltage CMOS device can be cost effectively up-integrated onto logic integrated circuits.

It is a further object of this invention that such a high voltage CMOS device be area efficient, as evidenced by a low $RDS_{on}$ value.

Lastly, it is still a further object of this invention that such a high voltage CMOS device be fabricated without a self-aligned implanted channel, so as to avoid the requirement for, and the disadvantages associated with, a high temperature drive step or multiple polysilicon gate formations.

In accordance with a preferred embodiment of this invention, these and other objects and advantages are accomplished as follows.

According to the present invention, there is provided a method for fabricating a high voltage CMOS device having an implanted channel which permits operation of the device at high voltages. The implanted channel does not require alignment with the gate electrode of the CMOS device, but is accurately aligned using direct wafer stepper photolithography techniques and implanted early in the fabrication of the device using known implantation methods. As a result, the non-self aligned implanted channel does not require the high temperature drive and the multiple polysilicon processing steps of a self-aligned implant, such that the processing steps for the high voltage CMOS device of this invention are compatible with VLSI and ULSI processes. In addition, the overlay tolerance capability of direct wafer stepper techniques is particularly suitable for accurately placing the non-self aligned implanted channel with respect to other critical process levels, resulting in low $RDS_{on}$ values. Furthermore, the device is characterized by a large field-induced avalanche breakdown voltage, which is further enhanced by a thick gate oxide, a lightly doped drain, and the use of field plating techniques.

The fabrication process of the high voltage CMOS device includes forming a lightly-doped well of one conductivity-type in a substrate of the opposite conductivity-type. A non-self aligned implanted channel of the opposite conductivity-type is then implanted in the well through a mask, preferably using direct wafer stepper techniques, after which a gate oxide layer is formed over the substrate and a polysilicon gate oxide is formed over a portion of the non-self aligned implanted channel to define the gate region of the high voltage CMOS device.

The drain and source are then both formed by heavily doping with ions of the same conductivity-type as the well. The drain region is spaced laterally from the non-self aligned implanted channel, while the source is formed within the non-self aligned implanted channel. The source also preferably has a second heavily-doped region which is contiguous with the first heavily-doped region, but of the opposite conductivity-type. As a result, the first region provides a conduction path from the source electrode to the non-self aligned implanted channel, while the second region simultaneously provides an ohmic contact between the source and the non-self aligned implanted channel. The conductive electrodes to the source, drain and gate can then be formed, with conventional VLSI or ULSI processes completing the fabrication of the device.

From the above, it can be seen that the fabrication process of this invention preferably uses direct wafer stepper technology for implanting the non-self aligned implanted channel. As a result, alignment tolerances of about 0.25 micrometers or less are possible, which significantly enhances the process manufacturability of the non-self aligned implanted channel. With this approach, it becomes unnecessary to self-align the channel with the gate electrode, as required by LDMOS fabrication techniques. The non-self aligned implanted channel provides an increased concentration of doping ions, which reduces the source-drain depletion spreading of the device. As a result, in conjunction with overlay accuracies possible with direct wafer stepper methods, the length of the channel can be reduced to enhance area efficiency while also increasing the current capability of the device.

In addition, the fabrication process of this invention allows for fabrication techniques which can enhance the field-induced avalanche breakdown voltage of the device. Specifically, the device preferably includes a thick gate oxide, a lightly doped drain and a field oxide region between the gate and the drain, while also employing field plating techniques.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

A method is provided for fabricating a high voltage CMOS transistor, wherein the processing steps of this method are compatible with VLSI and ULSI CMOS processes. As such, the high voltage CMOS transistor of this invention can be fabricated on the same substrate as low voltage VLSI or ULSI devices without effecting the electrical parameters of the low voltage devices, in that substantially no thermal or electrical stresses are imposed by the preferred processing steps of this invention. As such, the high voltage CMOS transistor can be integrated into existing integrated circuit designs without altering the logic characteristics or layout.

Figure 1:
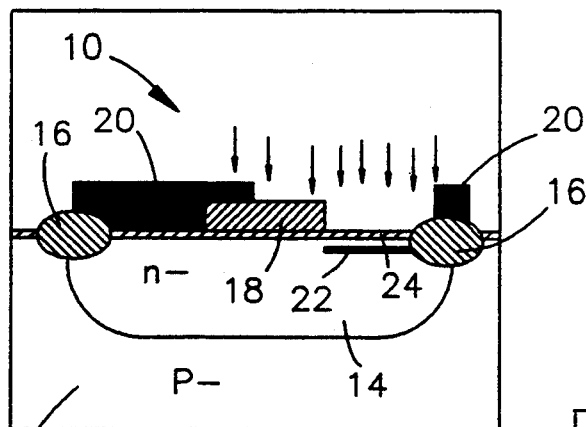
FIG. 1 shows a step in the fabrication of a prior art LDMOS device, during which a dopant is being implanted into the well such that the implant is self-aligned with the gate electrode of the LDMOS device.
Figure 2:
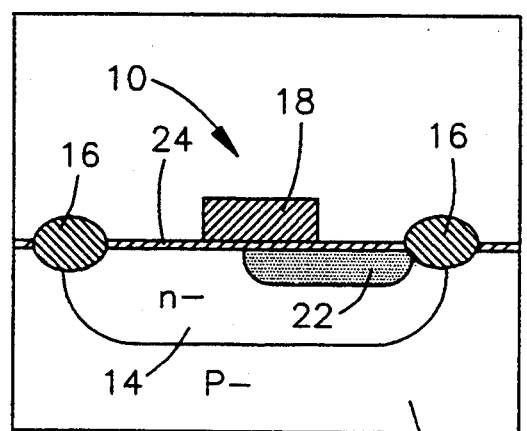
FIG. 2 shows a subsequent step in the fabrication of the LDMOS of FIG. 1, wherein a high temperature drive has been conducted to laterally drive the implant beneath the gate electrode of the LDMOS device.

The compatibility of the high voltage CMOS transistor of this invention with VLSI and ULSI processes is contrary to that of the LDMOS shown in FIGS. 1 and 2. As illustrated, prior art LDMOS devices 10 typically have a self-aligned p-type implant 22 within a N-well 14 formed in a p-type substrate 12. The self-aligned implant 22 is implanted in a conventional manner through a photoresist mask 20 deposited on the substrate 12 between a pair of field oxide regions 16. As previously discussed, the self-aligned implant 22 requires a high temperature drive after implantation to laterally diffuse the self-aligned implant 22 under the gate electrode 18, such that the channel defined by the self-aligned implant 22 extends beneath the gate of the device 10. As noted above, the required high temperature drive is generally incompatible with VLSI and ULSI processes, in that it causes the excessive diffusion of implants in other CMOS circuit devices formed on the same substrate, which may change the electrical characteristics of the devices and/or induce stresses that may lead to current leakage. Furthermore, the additional polysilicon processing steps required by the self-aligned implant technique are also undesirable from the standpoint of manufacturing costs, time and complexity.

The high voltage CMOS transistor of this invention avoids these and other disadvantages of LDMOS devices, as will become apparent from the following description. Referring to FIGS. 3 through 11, the principal processing steps for the fabrication of a high voltage CMOS transistor 30 are shown. In accordance with this invention, a non-self aligned implanted channel 50 (see FIGS. 6 through 11) is formed in the transistor 30—i.e., the implant is formed without being self-aligned with the gate electrode. Nor is a high temperature drive required to laterally diffuse the implant beneath the gate electrode. Accordingly, the transistor 30 of this invention offers processing advantages over LDMOS devices which enable the transistor 30 to be compatible with VLSI and ULSI CMOS processes.

While the preferred high voltage transistor 30 of this invention is an N-channel device, as illustrated in FIGS. 3 through 11, it is entirely foreseeable that a P-channel device may be fabricated in accordance with this invention, with modifications in the fabrication process being required as a result of each implantation step involving opposite conductivities. Furthermore, the processing steps described below which are not required for the formation of the non-self aligned implanted channel 50 of this invention, are intended to be merely illustrative, such steps being within the knowledge and abilities of one skilled in the art.

Figure 3:
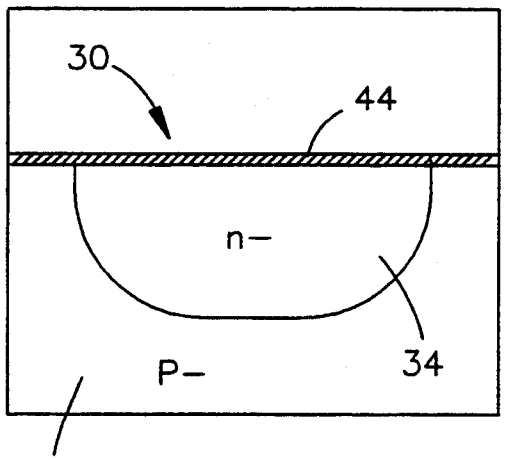
FIGS. 3 through 11 show successive processing steps for the fabrication of a high voltage transistor having a non-self aligned implanted channel in accordance with a preferred embodiment of this invention.

As shown in FIG. 3, the preferred fabrication method of the high voltage transistor 30 begins with the creation of a lightly-doped N-well region 34 within a lightly-doped p-type substrate 32. The N-well region 34 serves as the lightly-doped drain (LDD) region for the drain of the high voltage transistor 30. The substrate 32 shown is a portion of a monocrystalline silicon wafer which has been cut so that its top surface lies along a <100> crystallographic plane, as is usual in MOS technology. The wafer is sufficiently thick so as to permit handling, while the lateral dimensions of the wafer are generally large enough such that the wafer may be subsequently diced into a number of chips, each of which includes one or more transistors. Though numerous transistors, including both the high voltage CMOS transistor of this invention as well as conventional low voltage CMOS devices, can be fabricated on the wafer, the following discussion will be focused solely on the fabrication of a single high voltage CMOS transistor 30 on the substrate 32.

Preferably, in a typical embodiment designed to have a threshold voltage of about one to about three volts and an avalanche breakdown voltage of at least about 60 volts, the substrate 32 preferably has an average acceptor concentration of about $8 \times 10^{14}$ impurities/cm$^3$ to provide a resistivity of about 14 to about 22 ohms-cm. The N-well 34 is preferably about four micrometers deep with an average concentration of about $1 \times 10^{16}$ impurities/cm$^3$.

The lightly-doped N-well drain 34 shown in FIG. 3 is then created by donor-implanting the substrate 32. As is conventional, it is preferable that a barrier layer of silicon oxide (not shown) having a thickness of about 5500 Angstroms be thermally formed on the surface of the substrate 32. Using a photoresist mask (not shown) and known photolithographic techniques, the barrier layer is patterned to define the region of the substrate 32 in which the N-well drain 34 is to be formed. The barrier layer is then chemically etched down to the substrate surface and the photoresist mask is stripped. A thinner layer of silicon oxide (not shown) having a thickness of about 500 Angstroms is then formed over the exposed surface of the substrate 32 for purposes of protecting the substrate's surface during the subsequent ion implantation without significantly blocking the implantation.

Donor ions, typically phosphorus, are then implanted into the substrate 32 to form the lightly-doped N-well drain 34. The phosphorus ions are preferably subjected to an accelerating voltage of about 125 KeV to a dosage of about $4.5 \times 10^{12}$ ions/cm$^2$, and are directed at the substrate 32. The substrate 32 is then heated to a temperature of about 1200° C. for a duration of about four hours to drive the phosphorus ions deeper into the substrate 32, thereby forming the N-well drain 34. The thick and thin barrier layers of silicon oxide are then removed from the surface of the substrate 32 in any conventional manner. A protective oxide layer 44 having a thickness of about 500 Angstroms is then grown in a conventional manner on the surface of the substrate 32 which is designated for the high voltage CMOS transistor 30.

Figure 4:
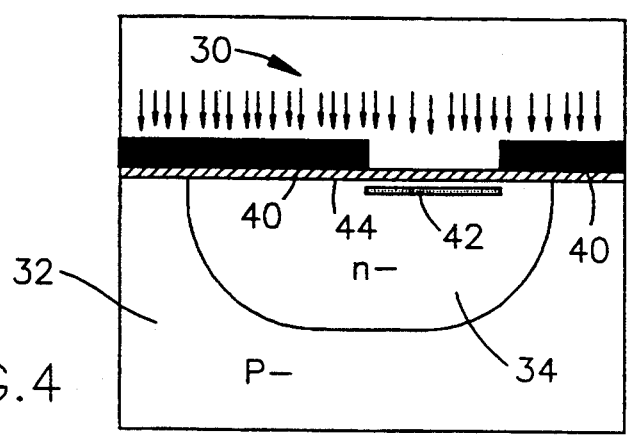

As seen in FIG. 4, a masked p-type implant is then performed in the N-well drain 34 for purposes of forming the non-self aligned implanted channel 50 of this invention. A masking layer of photoresist 40 is deposited over the oxide layer 44, and is then patterned in a conventional manner to expose the underlying oxide layer 44 through which the non-self aligned implanted channel 50 is to be formed. Acceptor ions, typically boron, are then implanted at a dosage of about $9 \times 10^2$ ions/cm$^2$ with an accelerating voltage of about 120 KeV to form the implant 42 shown.

Figure 5:
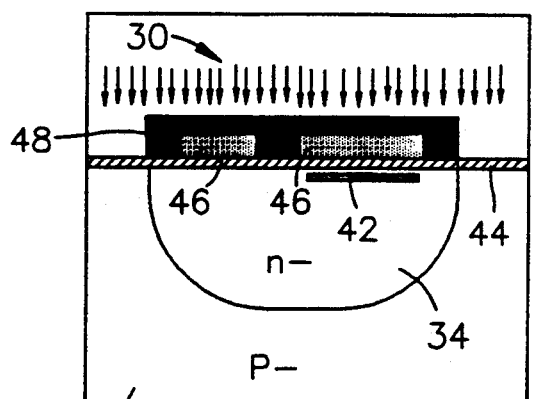

To define the active regions of the transistor 30, a layer of silicon nitride (not shown) is then deposited to a thickness of about 2000 Angstroms, conventionally using a low pressure chemical vapor deposition (LPCVD) process. A photolithographic mask and etch of the silicon nitride layer is then conducted so as to leave a silicon nitride pattern 46 on the oxidized surface of the substrate 32, such as to define the active regions of the transistor 30, as illustrated in FIG. 5. The surfaces of the substrate 32 not covered by the silicon nitride pattern 46 define the regions on which thick field oxide regions are to be formed.

To ensure against undesirable surface inversion effects in the substrate 32 under the designated field oxide regions, it is conventional to selectively implant acceptor ions in the p-type surface regions of the substrate 32 which underlie the designated field oxide regions. For this purpose, a photoresist layer is patterned to form a photoresist mask 48 over the silicon nitride pattern 46, as seen in FIG. 5. The photoresist mask 48 leaves exposed the surface regions of the substrate 32 which do not overlie the N-well drain 34. The substrate 32 is then implanted with acceptor ions, such as boron, preferably at a dosage of about $1 \times 10^4$ $ions/cm2$ and an accelerating voltage of about 35 KeV. The low accelerating voltage results in a very shallow p-type implant, which is not shown for purposes of clarity.

Figure 6:
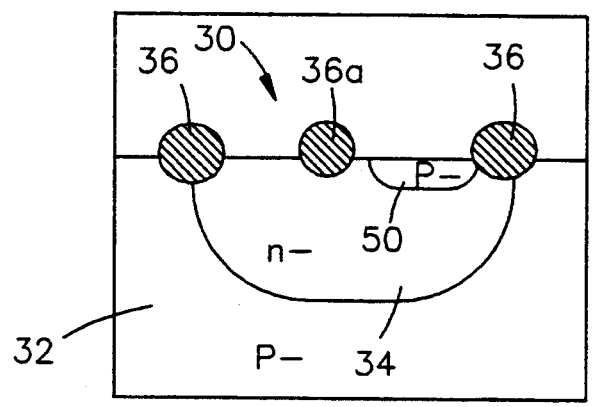

After this implantation step, the photoresist mask 48 is removed to expose the silicon nitride pattern 46. The substrate 32 is then heated to a temperature of about 1050° C. in nitrogen for a duration of about four hours to diffuse and activate the non-self aligned implanted channel 50. The temperature is then reduced to about 900° C. in a wet ambient so as to grow the desired thick field oxide regions 36 on the surface of the substrate 32 which is unprotected by the silicon nitride pattern 46, as shown in FIG. 6. Preferably, the field oxide regions 36 have a thickness of about 8500 Angstroms, which is sufficient to isolate the high voltage transistor 30 at the surface of the substrate 32 from other CMOS devices on the wafer.

In the preferred embodiment, the field oxide regions 36 grown in the above heating cycle include an intermediate field oxide region 36a. The intermediate field oxide region 36a is used to form a quasi-field plate in the lightly-doped N-well 34 drain, which reduces the electrical field in the direction normal to the substrate 32, so as to enhance the breakdown voltage of the transistor 30.

As indicated above, the heating step required to grow the field oxide regions 36 and 36a is preferably within the same heating cycle in which the p-type implant 42 forms the non-self aligned implanted channel 50 of this invention, as shown in FIG. 6. The non-self aligned implanted channel 50 preferably has an average impurity concentration of about $4 \times 10^{16}$ ions/cm$^3$ and a depth of about one micrometer.

After forming the field oxide regions 36 and 36a, the oxide layer 44 and the silicon nitride pattern 46 are removed by chemical etching so as to expose the underlying substrate 32, as shown in FIG. 6. What remains is the non-self aligned implanted channel 50 nested within the N-well drain 34, which is laterally isolated from adjacent CMOS devices (not shown) at the surface of the substrate 32 by the field oxide regions 36.

Figure 7:
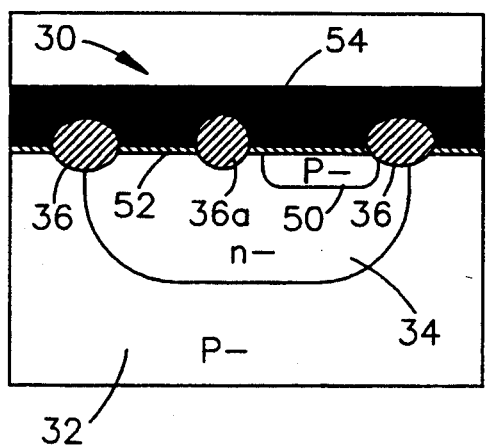

At this point, a sacrificial gate oxide 52 is grown to a thickness of about 400 Angstroms on the surface of the substrate 32, as shown in FIG. 7. The substrate 32 is then subjected to a light and shallow implant of acceptor ions, such as by doping with boron ions, for the purpose of setting the threshold voltages of the other CMOS devices on the substrate 32, as is known in the art. An illustrative dosage is $1.4 \times 10^{12}$ ions/cm$^2$ at an accelerating voltage of 35 KeV. The effect of this implantation is not indicated in FIG. 7 in that it effects only the surface concentration of acceptors and not the surface conductivity-type of the substrate 32. If preferred, this implantation step can be accomplished by selectively doping the substrate 32 with acceptor ions using a masking step.

Figure 8:
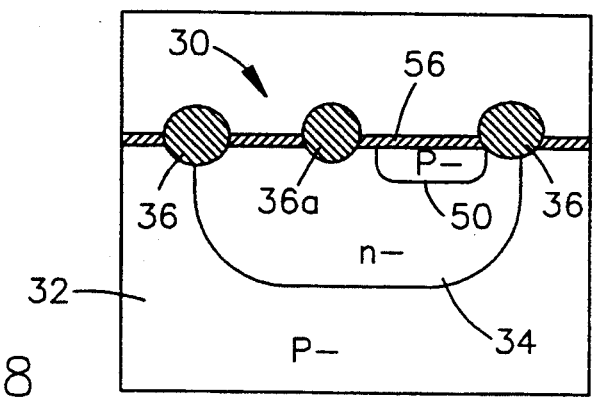

A gate oxide layer 56 is then formed over the surface of the substrate 32. To enhance the ruggedness of the transistor 30 so as to reduce the likelihood of electrical over stress (eos), the gate oxide layer 56 is preferably formed to be thicker than that for a conventional low voltage CMOS device. To form the thicker gate oxide layer 56 over the surface of the substrate 32 corresponding only to the high voltage transistor 30, a photoresist mask 54 is deposited on such surfaces of the substrate 32 to protect the active regions of the high voltage transistor 30, as shown in FIG. 7. A hydrofluoric acid etch is then used to remove the sacrificial gate oxide 52 from the surface regions of the substrate 32 corresponding to the low voltage CMOS devices (not shown) on the substrate 32, while leaving the sacrificial gate oxide 52 over the transistor 30 unaffected. The photoresist mask 54 is then removed and a final gate oxide layer is grown over the entire surface of the substrate 32. As shown in FIG. 8, this final gate oxide layer results in a thick gate oxide layer 56 over the surface of the substrate 32 designated for the transistor 30, with a preferred thickness being about 650 Angstroms. In contrast, this step produces a relatively thin gate oxide layer (not shown) over the low voltage regions of the substrate 32, with a preferred thickness being about 400 Angstroms.

Figure 9:
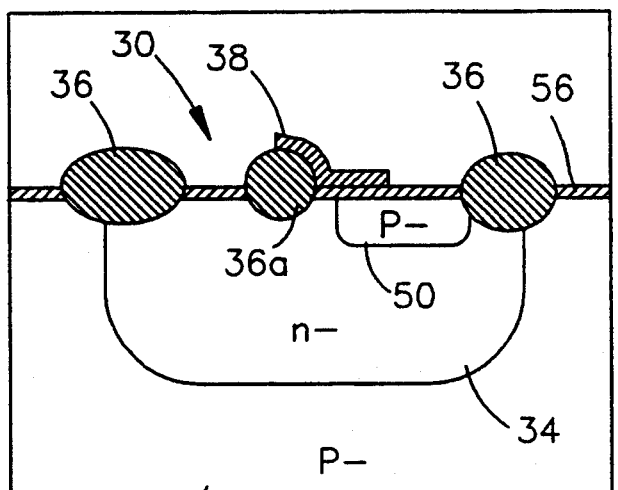

In the preferred embodiment, a polysilicon layer (not shown) is then deposited and etched in a conventional manner using a photoresist mask to form a polysilicon gate electrode 38, shown in FIG. 9. The polysilicon layer is preferably deposited using a low pressure chemical vapor deposition method to a thickness of about 3500 Angstroms. As is conventional, the polysilicon gate electrode 38 is preferably doped to make it highly conductive. As an example, the substrate 32 can be heated while exposed to a phosphorus gas to saturate the polysilicon layer with phosphorus. After the polysilicon gate electrode 38 is doped, it is also preferable to remove the phosphosilicate layer formed on its surface during the doping process.

As shown in FIG. 9, the polysilicon gate electrode 38 is preferably deposited on a portion of the intermediate field oxide region 36a, according to a technique known as poly field plating. The purpose of this field plating is to enhance the breakdown voltage of the transistor 30. With this approach, a breakdown voltage of greater than about 60 volts has been attained, while breakdown voltages of closer to about 30 volts have been obtained without the use of the field plating technique.

Figure 10:
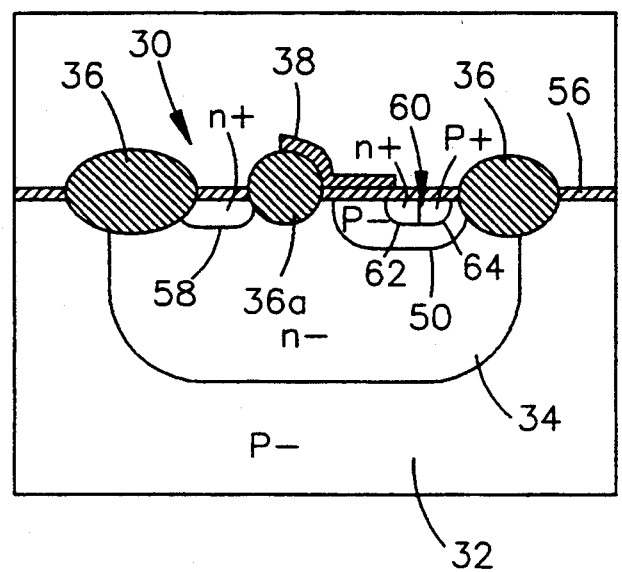

After forming the gate electrode 38, it is conventional to form heavily-doped drain and source regions 58 and 60 for ohmic contact as shown in FIG. 10. The polysilicon gate electrode 38 serves as a mask to ensure proper alignment of the source 60. The drain region 58 within the lightly-doped N-well 34 is heavily doped n-type, while the source 60 has both an n+ region 62 and a p+ region 64 which are shorted together, as is conventional with LDMOS devices. The n+ region 62 forms a conduction path to the non-self aligned implanted channel 50, while the p+ region 64 will serve as an ohmic contact between the source's electrode and the non-self aligned implanted channel 50.

Before forming the drain 58 and source 60, it is preferable to deposit a photoresist layer (not shown) on the surface of the substrate 32, and then pattern the photoresist layer to expose the surface areas of the substrate 32 which are to be implanted with donor ions. Because the source 60 is doped both n+ and p+, two separate photoresist patterns must be used to individually form each of the heavily doped regions 62 and 64.

The doping levels in the drain 58 and the n+ region 62 of the source 60 are preferably achieved by performing a co-doped implant of arsenic and phosphorus at a dosage of about $6.5 \times 10^{15}$ and about $1 \times 10^{14}$ ions/cm$^2$ and at an accelerating voltage of about 100 and about 70 KeV, respectively. This implantation is followed by annealing at about 900° C. for a duration of about 90 minutes. The p+ region 64 of the source 60 is preferably doped with boron difluoride (BF$_2$) at a dosage of $3 \times 10^{15}$ ions/cm$^2$ and at an accelerating voltage of 65 KeV.

Figure 11:
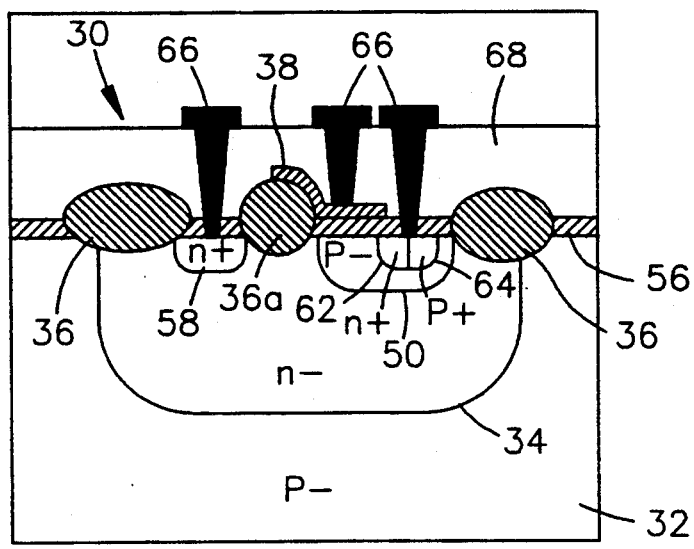

After completion of the implantation steps, the photoresist layer is removed, and the transistor 30 now has the appearance of that shown in FIG. 10. Electrodes 66 to the gate electrode 38, drain 58 and source 60 must now be formed, as well as a conventional passivation layer 68 which serves to protect the surface of the substrate 32, each of which are shown in FIG. 11. Typically, the passivation layer 68 is formed by coating the substrate 32 with a layer of phosphosilicate glass having a thickness of about 5000 Angstroms. The substrate 32 is then heated to a temperature of about 900° C. for a duration of about 15 minutes to densify the phosphosilicate glass, as is well known in the art.

To provide a more planar surface to the transistor 30, it is also preferable at this time to spin a layer of phosphosilicate glass over the phosphosilicate glass deposited in the previous step. This second layer is preferably 1000 Angstroms thick so as to fill any depressions in the surface of the passivation layer 68. Again, it is preferable to heat the substrate 32 to a temperature of about 825° C. for a duration of about 15 minutes in nitrogen so as to densify this second layer of phosphosilicate glass.

Afterwards, the electrodes 66 are formed by depositing a layer of photoresist (not shown) on the passivation layer 68, and then patterning the photoresist layer to expose the regions of the substrate 32 corresponding to the gate electrode 38, drain 58 and source 60. To better define the contact openings in the passivation layer 68, it is known in the art to treat the transistor 30 to an isotropic wet etchant, such as aqueous hydrofluoric acid, followed by an anisotropic dry plasma etch in a known manner. The electrodes 66 can then be formed by depositing a metal layer (not shown) having a thickness of about 6000 Angstroms over the passivation layer 68, such that the metal fills the contact openings. The metal layer is preferably an aluminum-copper-silicon alloy of about 98 weight percent aluminum, one weight percent copper and one weight percent silicon. The metal layer is then coated with a photoresist layer which is patterned to expose the regions of the metal layer which do not correspond to the desired locations of the electrodes 66. The metal layer can then be removed in a known manner to form the electrodes 66 shown in FIG. 11.

Thereafter, further fabrication of the high voltage transistor 30 can be completed by conventional VLSI or ULSI processing. Such processing includes providing a second layer of metal to interconnect the electrodes of the various CMOS devices on the wafer, as well as the requisite layers of oxide and/or nitride to form insulating and protective layers over the wafer, and then heating the wafer to passivate the metal layers. The wafer can then be diced into chips, some or all of which may include the high voltage transistor 30 of this invention depending on the particular application and processing steps used.

From the above, it can be seen that the high voltage CMOS transistor 30 of this invention can be fabricated using processing techniques which are generally conventional in the art. However, a distinguishing and inventive feature of this high voltage transistor 30 is the fabrication of a non-self aligned implanted channel 50, instead of the self-aligned implants known in the fabrication of LDMOS devices.

Similar to conventional LDMOS devices, the high voltage CMOS transistor 30 of this invention has an implanted channel within a lightly doped N-well region, in which the channel has an increased concentration of ions so as to decrease the depletion width spreading of the source-drain regions of the device. As a result, the length of the implanted channel can be reduced such that the device exhibits a low $RDS_{on}$ value, while also increasing the current capability of the device.

However, with the method taught by this invention, it is unnecessary to self-align the implanted channel using the gate electrode 38, as required by LDMOS fabrication techniques. Direct advantages of avoiding the self-aligned implant technique are the elimination of a high temperature drive step and multiple polysilicon gate formation steps, which are both generally incompatible with VLSI and ULSI CMOS processes for the reasons stated previously.

As a result, the formation of the non-self aligned implanted channel 50 is "transparent" to the electrical characteristics of low voltage devices on the same substrate 32, in that the non-self aligned implanted channel 50 can be formed early in the fabrication of the transistor 30 using mask implant and mask etch techniques which do not effect the electrical parameters of the low voltage devices. Therefore, the high voltage transistor 30 of this invention can be integrated into existing integrated circuit designs without altering their logic characteristics of layout. Such a capability is necessary when incorporating a high voltage device in VLSI or ULSI CMOS processes.

As an additional benefit, the non-self aligned implanted channel 50 can be formed prior to forming the gate electrode 38, alleviating fabrication constraints imposed by the self-alignment technique which otherwise necessitates that the gate electrode be formed first. In particular, the non-self aligned implanted channel 50 can be created before any of the active and polysilicon regions of the transistor 30 are defined.

In accordance with this invention, use of the current level of overlay accuracies available with direct stepper technology results in the high voltage transistor 30 of this invention having an $RDS_{on}$ value of about 700 ohms-sq. mil or less, while simultaneously being capable of achieving avalanche breakdown voltages in excess of about 60 volts. As a result of the low channel resistance, the transistor 30 of this invention has a higher current capacity than that of many high voltage transistors known in the art.

Features of this invention which, while optional in terms of forming the non-self aligned implanted channel 50, are advantageous in that they serve to enhance the field-induced avalanche breakdown voltage of the transistor 30, include the use of the thick gate oxide 56, the lightly doped N-well drain 34, and the use of poly field plating techniques in which the gate electrode 38 is formed over a portion of the intermediate field oxide region 36a. If desired, channel resistance can be reduced even further by omitting the poly field plating so as to produce a more area efficient device. Transistors fabricated in this manner have exhibited lower avalanche breakdown voltages of about 40 volts, but also have a lower channel resistance value on the order of about five to six ohms, which results in an even higher current capacity for the device. Under some circumstances, it may also be desirable to form a thin gate oxide in place of the thick gate oxide 56. Consequently, transistors formed without the use of the above steps are still within the scope of this invention.

Therefore, while our invention has been described in terms of a preferred embodiment, it is apparent that other forms could be adopted by one skilled in the art, for example by modifying the processing parameters such as the dopants or concentrations used or the temperatures or durations employed or by modifying the processing steps used so as to facilitate the formation of multiple lightly-doped regions, particularly for example where those lightly-doped regions would be used for LDMOS-type devices, or by altering the thicknesses or relative placement of the various layers, or by dicing the wafer such that only one high voltage CMOS transistor formed in accordance with this invention is present on a single chip. Accordingly, the scope of our invention is to be limited only by the following claims.

The embodiments of the invention in which an exclusive property or privilege is claimed are defined as follows:

1. A method for forming a non-self aligned implanted channel in a high voltage device so as to form a high voltage transistor on a substrate which includes low voltage devices, the method being compatible with VLSI and ULSI processes and comprising the steps of:

doping the substrate to be a first conductivity-type;
   forming a lightly-doped well of a second conductivity-type in the substrate;
   implanting through a mask an implant of the first conductivity-type in the lightly-doped well;
   diffusing and activating the implant so as to form the non-self aligned implanted channel without adversely effecting implants formed in the low voltage devices of the substrate;
   forming a gate oxide layer over at least a portion of the substrate;
   forming a gate electrode over a portion of the non-self aligned implanted channel, the gate electrode defining a gate region of the high voltage transistor;
   forming a drain region of the second conductivity-type in the lightly-doped well to form an ohmic contact;
   forming a source region within the non-self aligned implanted channel, the source region having a doped first region of the first conductivity-type which is contiguous with a heavily doped second region of the second conductivity-type, the first region providing an ohmic contact between the source region and the non-self aligned implanted channel, the second region providing a conduction path to the non-self aligned implanted channel; and
   forming conductive electrodes to the source, drain and gate regions;
   whereby the step of forming the non-self aligned implanted channel does not effect the electrical characteristics of the low voltage devices of the substrate.

2. A method as recited in claim 1 further comprising the step of forming a field oxide region between the gate region and the drain region, the gate electrode being formed over a portion of the field oxide region.

3. A method as recited in claim 2 wherein the step of forming the field oxide region serves to diffuse and activate the non-self aligned implanted channel.

4. A method as recited in claim 1 further comprising the step of laterally isolating the drain region and the source region from the low voltage devices of the substrate with corresponding field oxide regions.

5. A method for forming a high voltage transistor having a non-self aligned implanted channel, wherein the high voltage transistor exhibits an enhanced breakdown voltage and wherein the high voltage transistor is formed in a p-type monocrystalline silicon substrate with low voltage semiconductor devices with VLSI and ULSI processes, the method comprising the steps of:

forming a lightly-doped N-well drain in the substrate so as to form a high voltage region of the substrate, a remaining portion of the substrate defining a low voltage region of the substrate;
   implanting a p-type implant into the lightly-doped N-well drain through a mask;
   defining drain, source and gate regions of the high voltage transistor by forming field oxide regions at opposite ends of the high voltage region and by forming an intermediate field oxide region between the drain and gate regions, the intermediate field oxide region being located laterally adjacent to the p-type implant, the step of forming the intermediate field oxide region serving to diffuse and activate the p-type implant so as to form the non-self aligned implanted channel without adversely effecting implants formed in the low voltage semiconductor devices of the substrate;
   forming a gate oxide layer over the substrate;
   forming a polysilicon gate electrode over a portion of the non-self aligned implanted channel and over a portion of the intermediate field oxide region, the polysilicon gate electrode further defining the gate region of the high voltage transistor;
   implanting the drain region so as to have a heavily doped n-type region within the lightly-doped N-well drain for ohmic contact;
   implanting the source region within the non-self aligned implanted channel so as to have a heavily-doped p-type region which is contiguous with a heavily-doped n-type region, the p-type region providing an ohmic contact between the source region and the non-self aligned implanted channel, the n-type region providing a conduction path to the non-self aligned implanted channel; and
   forming conductive electrodes to the source, drain and gate regions;
   whereby formation of the non-self aligned implanted channel does not effect the electrical characteristics of the low voltage semiconductor devices of the substrate.

6. A method as recited in claim 5 wherein the step of implanting is performed with a photoresist mask.

7. A method as recited in claim 5 wherein the step of forming the polysilicon gate electrode over a portion of the field oxide enhances the breakdown voltage of the high voltage transistor.

8. A method as recited in claim 5 wherein the step of forming the gate oxide layer over the substrate results in the gate oxide layer being sufficiently thick so as to inhibit electrical overstress of the gate oxide layer.

9. A method as recited in claim 5 further comprising the steps of:

masking the high voltage region of the substrate after the step of forming the gate oxide layer;
   etching the gate oxide layer from the low voltage region of the substrate; and
   forming an additional gate oxide layer over both the low voltage region and the high voltage region so as to create a gate oxide layer over the low voltage region and a gate oxide layer over the high voltage region, the gate oxide layer over the high voltage region being sufficiently thick so as to inhibit electrical overstress in the high voltage region.

10. A method as recited in claim 5 wherein the step of forming the field oxide regions at opposite ends of the high voltage region provides lateral isolation of the drain region and the source region from the low voltage semiconductor devices on the substrate.

11. A method as recited in claim 5 wherein the step of implanting the p-type implant is performed with a photoresist mask.

12. A method as recited in claim 5 wherein the high voltage transistor is a CMOS transistor.

* * * * *